United States Patent
Lu et al.

(10) Patent No.: US 11,953,527 B2
(45) Date of Patent: Apr. 9, 2024

(54) PEAK VOLTAGE AMPLITUDE DETECTORS TOLERANT TO PROCESS VARIATION AND DEVICE MISMATCH AND RELATED METHODS

(71) Applicant: Microsoft Technology Licensing, LLC, Redmond, WA (US)

(72) Inventors: Ping Lu, Cary, NC (US); Shaishav A. Desai, San Diego, CA (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/894,626

(22) Filed: Aug. 24, 2022

(65) Prior Publication Data

US 2024/0069074 A1    Feb. 29, 2024

(51) Int. Cl.
    *G01R 19/04*      (2006.01)
    *H03K 5/1532*    (2006.01)

(52) U.S. Cl.
    CPC ........... *G01R 19/04* (2013.01); *H03K 5/1532* (2013.01)

(58) Field of Classification Search
    CPC ........ G01R 19/04; H03K 5/1532; H04L 7/00; H04B 17/318; H02M 1/0009; H02M 7/217
See application file for complete search history.

(56) References Cited

U.S. PATENT DOCUMENTS

| | | | |
|---|---|---|---|
| 5,388,010 A * | 2/1995 | Norton, Jr. | .......... G11B 5/59611 |
| 6,121,799 A | 9/2000 | Moser | |
| 6,735,260 B1 | 5/2004 | Eliezer et al. | |
| 9,531,389 B1 | 12/2016 | Behbahani | |
| 10,686,453 B2 * | 6/2020 | Bushman | .............. H03L 7/0802 |
| 10,735,177 B2 | 8/2020 | Ogata et al. | |
| 2007/0013456 A1 | 1/2007 | Lee et al. | |
| 2011/0115525 A1 | 5/2011 | Presti et al. | |
| 2014/0035684 A1 | 2/2014 | Na et al. | |
| 2014/0266308 A1 * | 9/2014 | Goltman | ................ G01R 19/04 327/56 |

(Continued)

OTHER PUBLICATIONS

Baert, et al., "A 5-GS/s 7.2-ENOB Time-Interleaved VCO-Based ADC Achieving 30.5 fJ/cs", In IEEE Journal of Solid-State Circuits, vol. 55, Issue 6, Jun. 2020, pp. 1577-1587.

(Continued)

*Primary Examiner* — Lincoln D Donovan
*Assistant Examiner* — Tyler J Pereny
(74) *Attorney, Agent, or Firm* — Withrow & Terranova, PLLC

(57) ABSTRACT

A peak detector comprises multiple small-size amplitude detection circuits coupled in parallel to signal inputs at which a signal is received from a VCO. Each amplitude detection circuit generates a voltage on an output, indicating a voltage peak or amplitude of a first signal input and a second signal input (specifically, differential output of VCO). At a given time, only one small-size amplitude detection circuit is activated to load VCO, reducing the impact on LC resonant frequency. The plurality of small-size detection circuits work sequentially, and an automatic averaging of their outputs can significantly improve the peak detector fluctuation (caused by process variation and device mismatch) compared to each single small-size amplitude detection circuit.

18 Claims, 10 Drawing Sheets

(56) References Cited

U.S. PATENT DOCUMENTS

2016/0238637 A1    8/2016   Yin
2022/0109435 A1    4/2022   Das

OTHER PUBLICATIONS

Liempd, et al., "A 3 µW Fully Differential RF Envelope Detector for Ultra-low Power Receivers", In Proceedings of IEEE International Symposium on Circuits and Systems, May 20, 2012, pp. 1496-1499.
"International Search Report and Written Opinion Issued in PCT Application No. PCT/US23/027208", dated Oct. 27, 2023, 14 Pages.

* cited by examiner

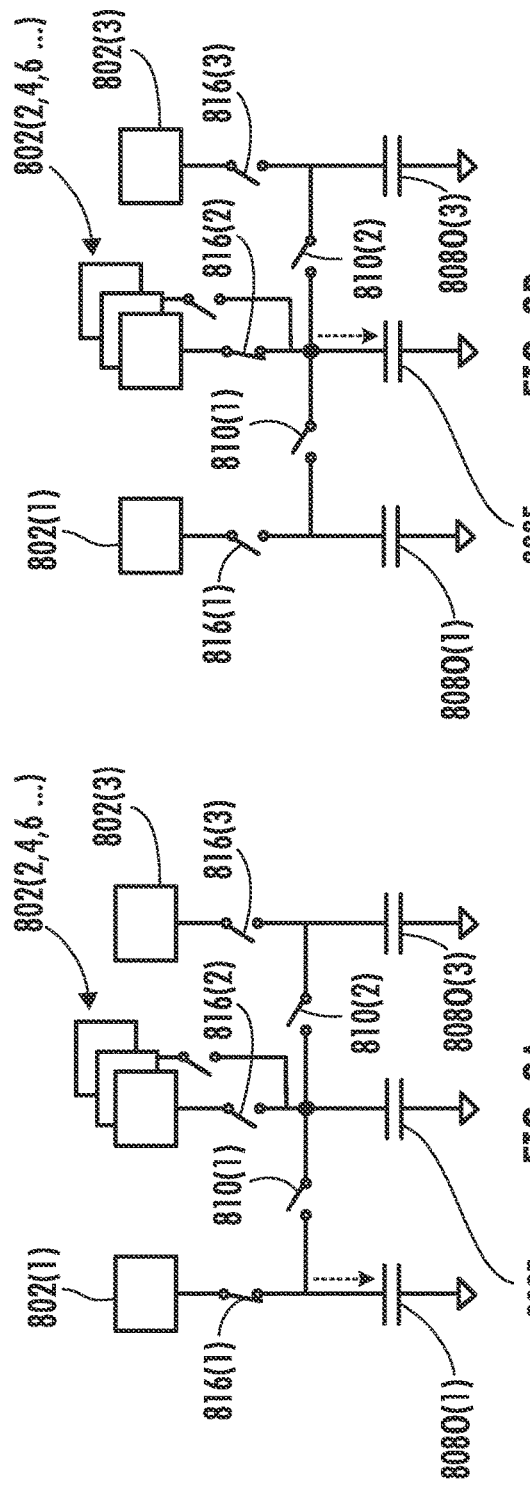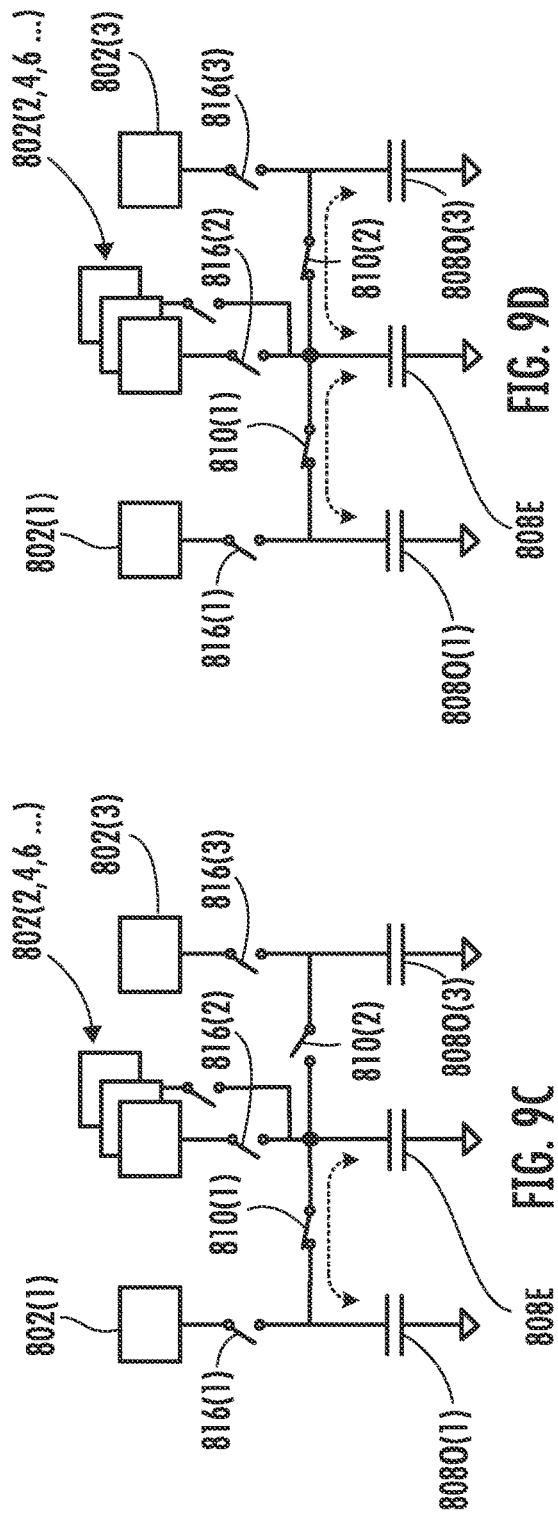

PEAK VOLTAGE AMPLITUDE DETECTORS TOLERANT TO PROCESS VARIATION AND DEVICE MISMATCH AND RELATED METHODS

FIELD OF THE DISCLOSURE

The technology of the disclosure relates in general to phase-locked-loops (PLL) and, more particularly, to maintaining a stable amplitude of a PLL output signal.

BACKGROUND

Wireless communication is utilized in smart telephones and other mobile devices for voice communication and numerous other applications. To support the increasing need in this area, the fifth-generation new radio (5G-NR) technology provides high-speed cellular communication and the Internet of Things over several different frequency bands in a wide range of frequencies. Wired transmission media also supports multiple simultaneous transmissions using frequency division methods. To avoid interference between signals transmitted simultaneously over the same wired and wireless transmission media, the transmitted signals need to be kept at frequencies that are within their allocated frequency bands.

In this regard, a transmitter includes a phase-locked-loop (PLL) circuit to keep the frequencies of transmitted signals within designated frequency ranges. The PLL provides control signals to a voltage-controlled oscillator (VCO) to generate a signal with a desired amplitude and frequency. A peak detector is used to monitor the amplitude of the generated signal. The peak detector detects the amplitude of voltage oscillations of the signal and provides feedback to the PLL to adjust the control signals to the VCO to correct the amplitude when it deviates out of a desired amplitude range. As voltage levels decrease to reduce power consumption with advances in technology, the desired range of the peak amplitude of the signal voltage decreases, so the accuracy of a peak detector becomes more important. In addition, the accuracy of circuits, including peak detectors, tend to vary across manufacturing "process corners, such that operating characteristics of devices will mismatch (e.g., be inconsistent).

SUMMARY

Exemplary aspects disclosed herein include peak voltage amplitude detectors tolerant to process variation and device mismatch. Methods of detecting a peak voltage amplitude are also disclosed. A peak voltage amplitude detector ("peak detector") in an integrated circuit (IC) is employed in a phase-locked loop (PLL) to monitor a peak amplitude of a signal generated by a voltage-controlled oscillator (VCO). The transistors used in peak detectors in different devices or ICs will inevitably be from different manufacturing process corners, causing differences in operating characteristics, but output variations among such devices (or ICs) are significantly reduced when input signals to the peak detectors are provided with a higher alternating current (AC) input amplitude. The AC input amplitude depends on a ratio of coupling capacitance and load capacitance of the peak detector circuit. Using smaller transistors, having smaller load capacitance can increase the AC input amplitude but can result in large variations from one IC to another due to device mismatch. In this regard, in exemplary aspects, a peak detector is provided that comprises a plurality of amplitude detection circuits coupled in parallel to signal inputs at which a signal is received from a VCO. Each amplitude detection circuit generates a voltage on an output, indicating a voltage difference between a first signal input and a second signal input. The amplitude detection circuits are activated one at a time (e.g., sequentially, in a rotation) to capture the peak voltages of the received signal at different times, for example. The amplitude detection circuits include averaging circuits to generate an average voltage based on an average of the voltages captured in the plurality of amplitude detection circuits. The amplitude detection circuits of the peak detector may employ smaller transistors to maintain a higher AC input amplitude, and the averaging circuit averaging the voltages of the plurality of amplitude detection circuits reduces performance variations from IC to IC compared to peak detectors comprising a single amplitude detection circuit.

In an exemplary aspect, a peak detector comprising a plurality of amplitude detection circuits coupled in parallel to a first signal input and a second signal input is disclosed. Each of the plurality of amplitude detection circuits is configured to generate, on an output, a peak voltage indicating an amplitude of an input signal received on the first signal input and the second signal input. The peak detector also comprises an averaging circuit coupled to the output of each of the plurality of amplitude detection circuits, the averaging circuit configured to generate, on a peak detector output, an average voltage comprising an average of the peak voltages on the outputs of the plurality of amplitude detection circuits.

In another exemplary aspect, an IC comprising: a transmitter configured to generate a transmission signal and a PLL comprising a voltage-controlled oscillator (VCO) are disclosed. The VCO is configured to generate an output signal having an amplitude based on a control voltage, the PLL is configured to control a frequency of the transmission signal. The PLL further includes a peak detector comprising: a plurality of amplitude detection circuits coupled in parallel to a first signal input and a second signal input. Each of the plurality of amplitude detection circuits configured to generate a voltage on an output indicating a voltage difference between the first signal input and the second signal input. The peak detection further includes an averaging circuit coupled to the output of each of the plurality of amplitude detection circuits, the averaging circuit configured to generate, on a peak detector output, an average voltage comprising an average of the voltages generated on the outputs of the plurality of amplitude detection circuits. The PLL further includes a range sensor configured to determine whether the average voltage on the peak detector output is outside a voltage range and adjust the control voltage in response to determining the average voltage on the peak detector output is outside a voltage range.

In another exemplary aspect, a method of detecting an amplitude in a peak detector comprising a plurality of amplitude detection circuits coupled in parallel to a first signal input and a second signal input is disclosed. Each of the plurality of amplitude detection circuits comprises an output, an averaging circuit coupled to the output of each of the plurality of amplitude detection circuits, and a peak detector output. The method comprises: generating, on the output of each of the plurality of amplitude detection circuits, a peak voltage indicating an amplitude of an input signal received on the first signal input and the second signal input; and generating, on the peak detector output, an average voltage comprising an average of the peak voltages on the outputs of the plurality of amplitude detection circuits.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIGS. 9A-9D are a series of schematic diagrams illustrating operation of the averaging circuit in FIG. 7;

Figure 10:
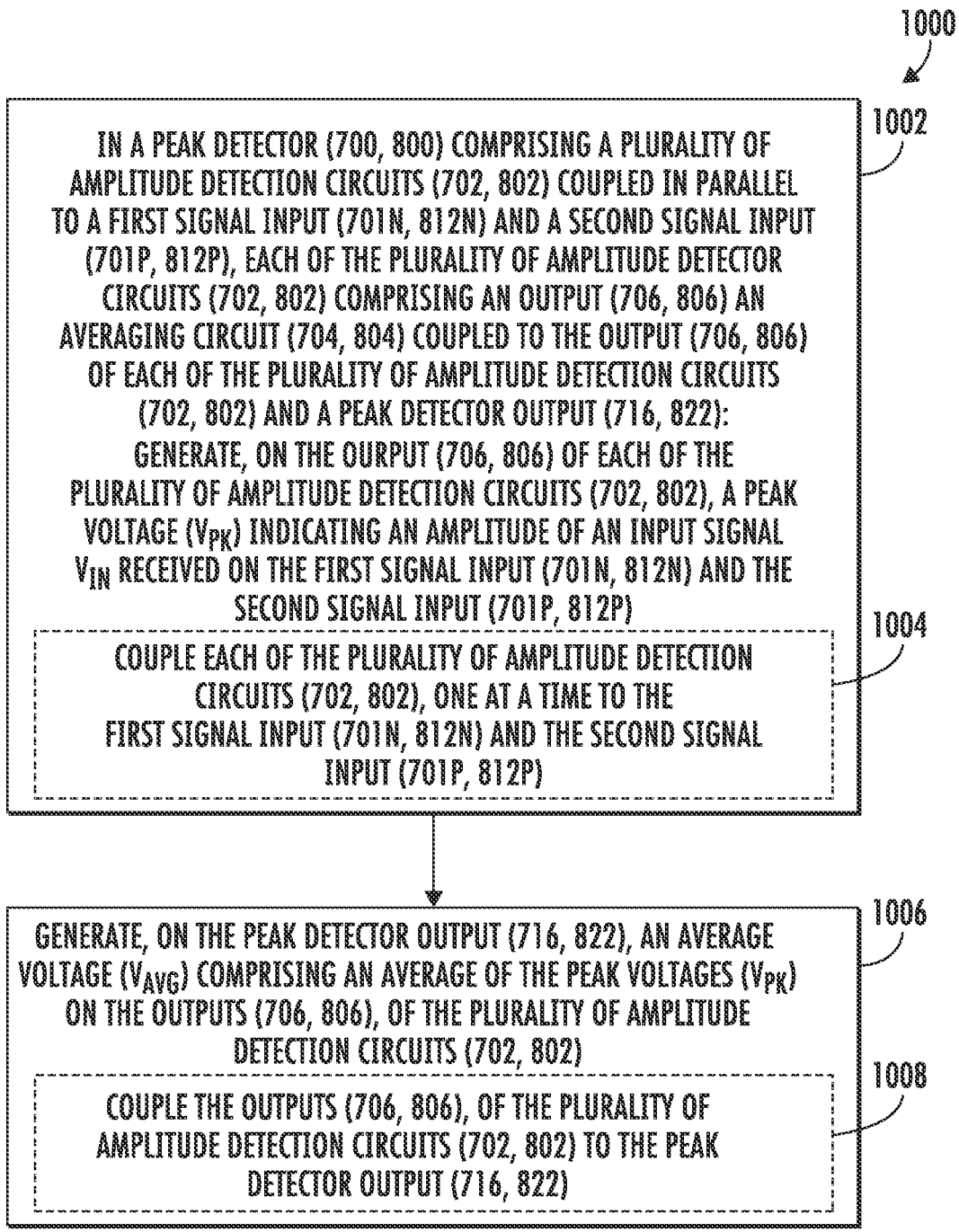
Figure 11:
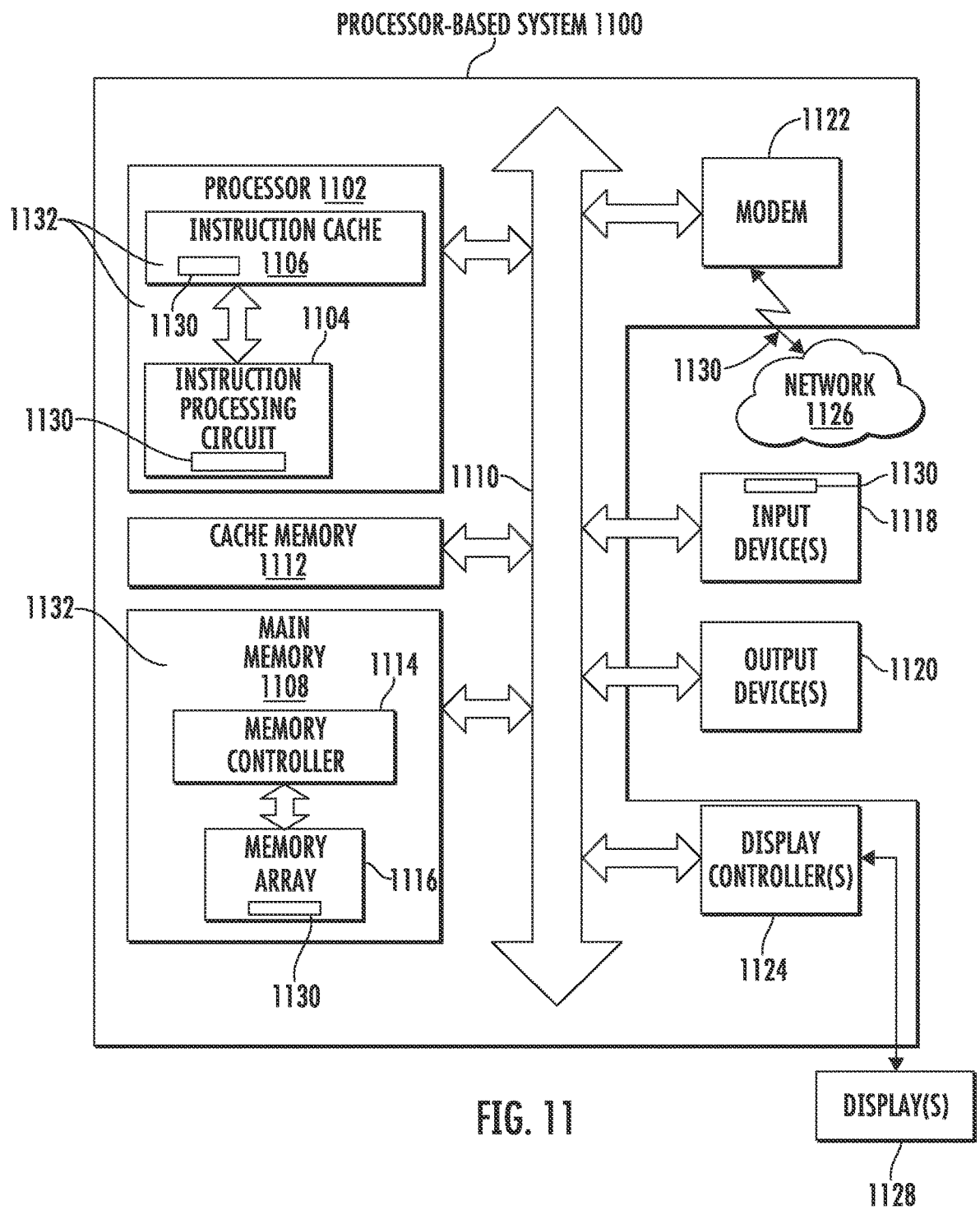

FIG. 10 is a flowchart illustrating a method of detecting a peak amplitude in a peak detector comprising a plurality of amplitude detection circuits in parallel; and FIG. 11 is a block diagram of an exemplary processor-based system including a plurality of devices coupled together through a system bus, wherein the processor-based system comprises at least one integrated circuit (IC), including a VCO with a peak detector including a plurality of amplitude detection circuits for tolerance to process variations and device mismatch.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include process and mismatch tolerant peak voltage amplitude detectors. Methods of detecting a peak voltage amplitude are also disclosed. A peak voltage amplitude detector ("peak detector") in an integrated circuit (IC) is employed in a phase-locked loop (PLL) to monitor a peak amplitude of a signal generated by a voltage-controlled oscillator (VCO). The transistors used in peak detectors in different devices or ICs will inevitably be from different manufacturing process corners, causing differences in operating characteristics, but output variations among such devices (or ICs) are significantly reduced when input signals to the peak detectors are provided with a higher alternating current (AC) input amplitude. The AC input amplitude depends on a ratio of coupling capacitance and load capacitance of the peak detector circuit. Using smaller transistors, having smaller load capacitance can increase the AC input amplitude but can result in large variations from one IC to another due to device mismatch. In this regard, in exemplary aspects, a peak detector is provided that comprises a plurality of amplitude detection circuits coupled in parallel to signal inputs at which a signal is received from a VCO. Each amplitude detection circuit generates a voltage on an output, indicating a voltage difference between a first signal input and a second signal input. The amplitude detection circuits are activated one at a time (e.g., sequentially, in a rotation) to capture the peak voltages of the received signal at different times, for example. The amplitude detection circuits include averaging circuits to generate an average voltage based on an average of the voltages captured in the plurality of amplitude detection circuits. The amplitude detection circuits of the peak detector may employ smaller transistors to maintain a higher AC input amplitude, and the averaging circuit averaging the voltages of the plurality of amplitude detection circuits reduces performance variations from IC to IC compared to peak detectors comprising a single amplitude detection circuit.

Before describing examples of exemplary peak detectors according to the present disclosure, with reference to FIGS. 5-8, an example of a phase-locked loop (PLL) 100 is briefly described with reference to FIG. 1. An example of a voltage-controlled oscillator (VCO) 200 is shown in FIG. 2, and examples of peak detector circuits are discussed with reference to FIGS. 3 and 4.

Figure 1:
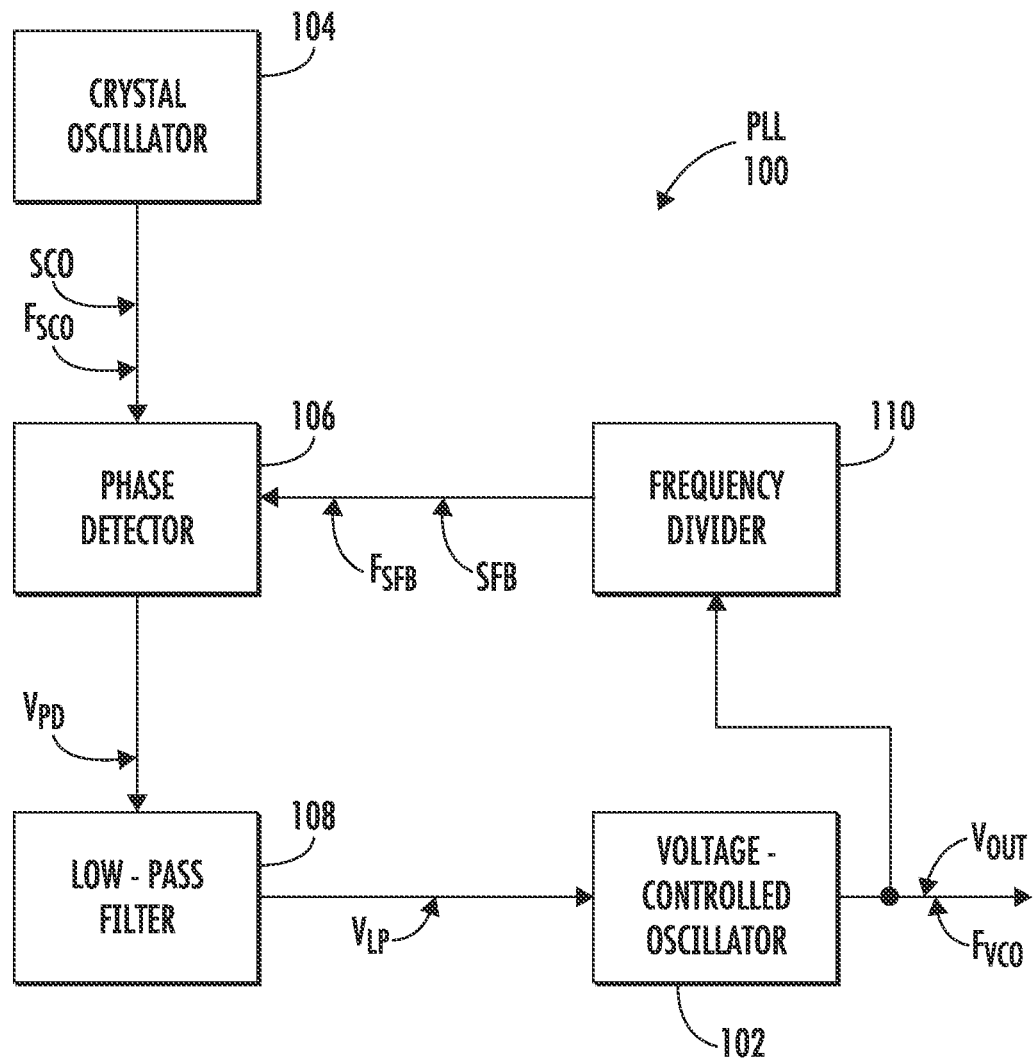
FIG. 1 is a block diagram of a phase-locked-loop (PLL), including a voltage-controlled-oscillator (VCO)

FIG. 1 is a schematic diagram of the PLL 100, including an exemplary VCO 102 as well as conventional components. A crystal oscillator 104 provides a signal SCO that oscillates at a stable frequency. The signal SCO is provided to a phase detector 106, which compares the frequency $F_{SCO}$ of the signal SCO with the frequency $F_{SFB}$ of a feedback signal SFB and generates a voltage signal $V_{PD}$ based on a phase/frequency difference between the frequencies $F_{SCO}$ and $F_{SFB}$. The voltage signal $V_{PD}$ is provided to a low-pass filter 108 that removes noise and high-frequency components in the voltage signal $V_{PD}$ by the phase detector 106. The low-pass filter 108 produces a voltage signal $V_{LP}$ that is provided to the VCO 102 to control a frequency $F_{VCO}$ of an output signal $V_{OUT}$ at a desired frequency $F_{OUT}$. The output signal $V_{OUT}$ may be used to determine a frequency of a wired or wireless signal transmitted by a transmitter (not shown). The output signal $V_{OUT}$ is also fed back to the phase detector 106 to determine whether the frequency $F_{SCO}$ of the signal SCO is too fast or too slow and also to determine whether the output signal $V_{OUT}$ is out of phase with the signal SCO. Typically, as in the PLL 100, the output signal $V_{OUT}$ is a multiple of (e.g., N times) the frequency $F_{SCO}$ of the signal SCO, so the output signal $V_{OUT}$ is first divided (e.g., by N) in a frequency divider 110 before being provided to the phase detector 106 as the feedback signal SFB. Although not shown in FIG. 1, the PLL 100 also includes circuitry to monitor and adjust an amplitude of the output signal $V_{OUT}$ according to a desired output power level.

Figure 2:
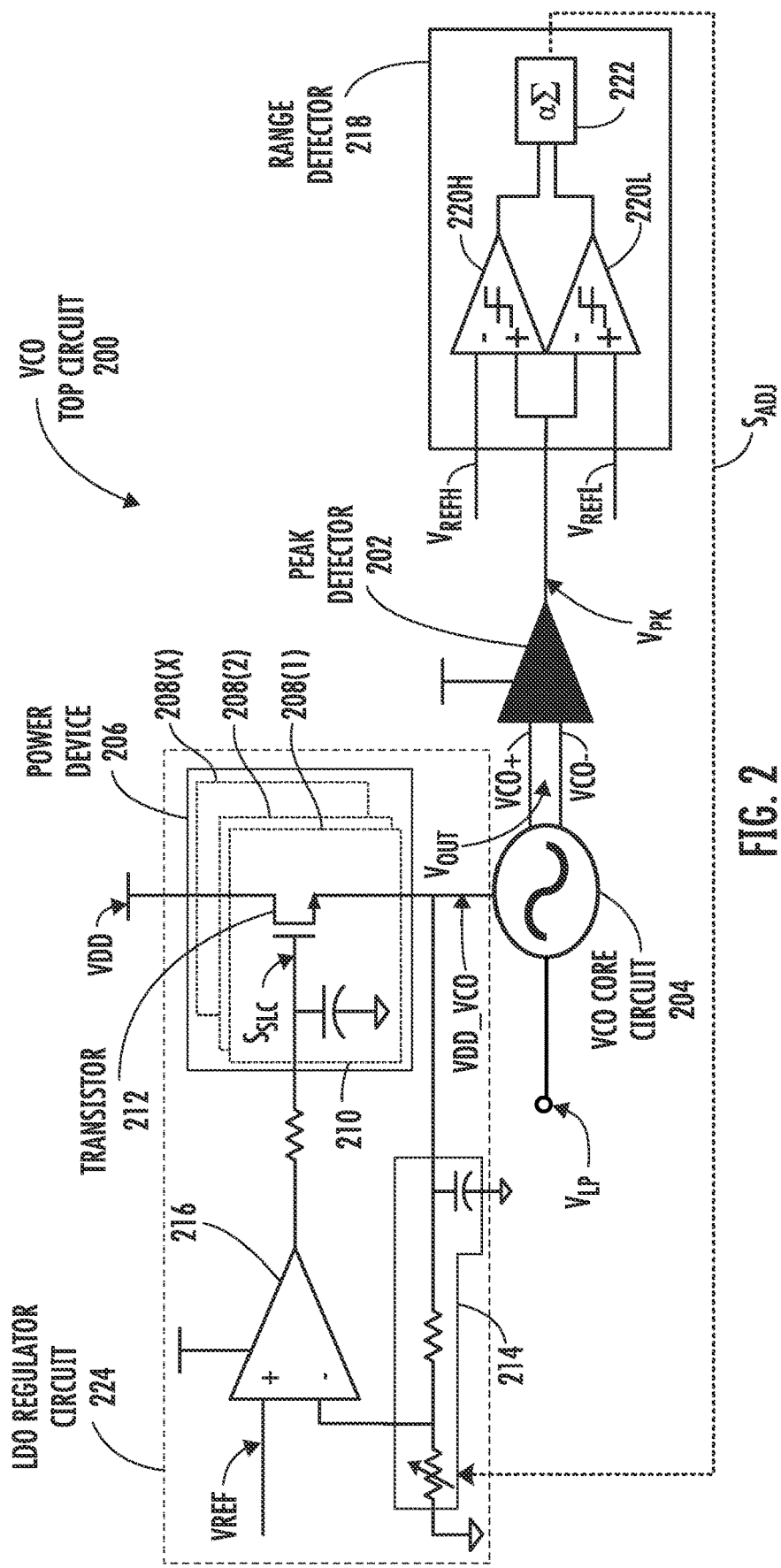
FIG. 2 is a schematic diagram of a VCO circuit with a regulated voltage supply and an exemplary peak detector to determine whether an output signal of the VCO circuit is within a desired range.

FIG. 2 is an illustration of an exemplary VCO top circuit 200 that may be the VCO 102 in FIG. 1 and is provided as an example of a circuit in which an exemplary peak detector 202 may be employed. The VCO top circuit 200 includes a VCO core circuit 204 to generate the output signal $V_{OUT}$, which may be an output signal of the PLL 100 in FIG. 1 provided to a transmitter (not shown) for wired or wireless communications. In some examples, the VCO core circuit 204 may be an LC tank circuit with inductive (L) and capacitive elements (C), as known in the art. The amplitude of the output $V_{OUT}$ of the VCO core circuit 204 is impacted by the regulated supply voltage VDD_VCO, which is generated by a low-drop output regulator (LDO) circuit 224. Within the range/level that a process allows, a higher VDD_VCO results in a larger $V_{OUT}$ amplitude, corresponding to a lower VCO output noise. Other types of VCO circuits may be used in the PLL 100 in FIG. 1, and such VCO circuits may also employ the peak detectors as disclosed herein.

A power device 206 in LDO regulator circuit 224 isolates the VCO core circuit 204 from noise that may be included in the external power supply VDD. In this example, the power device 206 includes a plurality of power circuit "slices" 208(1)-208(X) coupled in parallel to each other. Each of the slices 208(1)-208(X) in FIG. 2 includes a capacitor 210 to reduce noise in a control signal $S_{SLC}$ controlling a transistor 212. Depending on the power requirement, a sufficient number of the slices 208(1)-208(X) are enabled to supply, in parallel, the required level of power to the VCO circuit 204. The supply voltage VDD_VCO is generated by the slices 208(1)-208(X), which are under the influence of a feedback circuit 214 that receives feedback signal $S_ADJ$ generated by the peak detector 202. An operational amplifier 216 helps to produce the gate control signal $S_{SLC}$ for power device 206 based on a reference voltage VREF and the feedback circuit 214.

The VCO core circuit 204 generates the output signal $V_{OUT}$ as a differential signal on outputs VCO+ and VCO−. In the example of a transmitter including the PLL 100 in FIG. 1, the output signal $V_{OUT}$ is provided to the peak detector 202 at a maximum sustainable amplitude (i.e., voltage) that does not cause damage to the circuits therein. The maximum sustainable amplitude is determined as a point that is in the high end of the voltage range of the transistors but low enough to avoid device damage over the long term, which would reduce device life expectancy. Therefore, it is preferable to be as close as possible to the maximum sustainable amplitude to maximize power and efficiency.

In this regard, the VCO top circuit 200 includes the peak detector 202 to keep the amplitude of the output signal $V_{OUT}$ within a small range close to the maximum sustainable amplitude. The peak detector 202 stores (e.g., captures) and generates a peak voltage $V_{PK}$ indicating a maximum detected amplitude of the output signal $V_{OUT}$. A range detector 218 determines whether the peak voltage $V_{PK}$ is outside the desired range and generates the feedback signal $S_ADJ$ to the feedback circuit 214. In response, the feedback circuit 214 causes the VCO core circuit 204 to adjust the amplitude of the output signal $V_{OUT}$ up or down accordingly. The range detector 218 includes comparators 220H and 220L to compare the peak voltage $V_{PK}$ to a high reference voltage $V_{REFH}$ and a low reference voltage $V_{REFL}$, respectively, which are the upper and lower limits of the desired voltage range for the output signal $V_{OUT}$. The comparator 220H and 220L may give +1 (220L sends out "1" and 220H sends out "0"), 0 (both 220L and 220H send out "0"), or −1 (220L sends out "0" and 220H sends out "1") which indicate $V_{OUT}$ amplitude is above, within, or lower than the desired range, respectively. An accumulator circuit 222 helps to accumulate the comparator result after a scaling to generate the feedback signal $S_ADJ$ indicating the direction of adjustment needed (i.e., to raise or lower the peak amplitude).

However, peak detectors also include circuits that may be affected by process corners, which can cause significant performance mismatch between different peak detectors. In an exemplary aspect disclosed below, the peak detector 202 is tolerant to manufacturing process variations and device mismatch.

Figure 3:
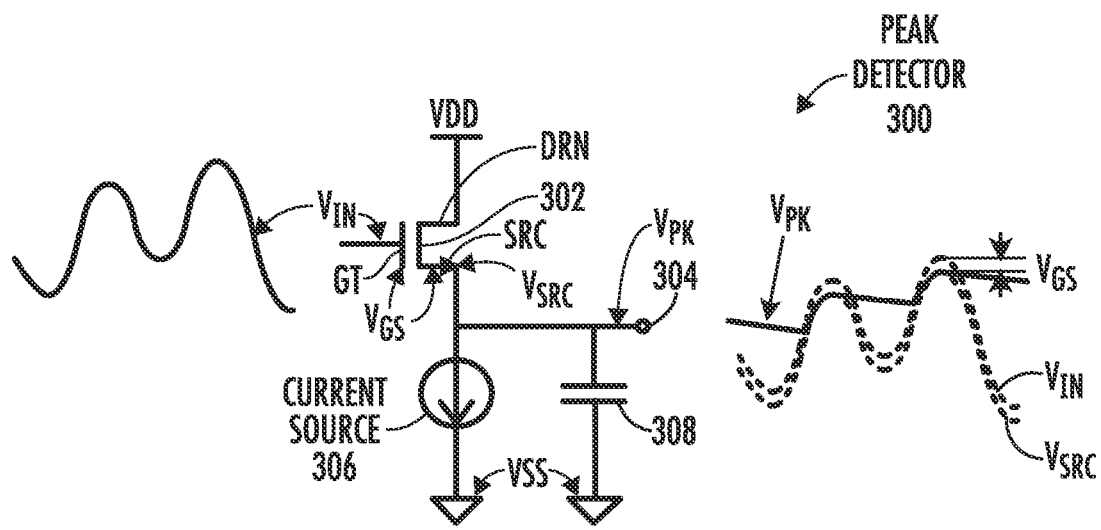
FIG. 3 is a schematic diagram of a source follower circuit with a capacitor for capturing a peak voltage of an input signal and illustrations of an output signal compared to the input signal.

First, examples of circuits that may be employed in the peak detector 202 are described with reference to FIGS. 3 and 4. FIG. 3 is a schematic diagram of a peak detector 300 used to capture a peak of each oscillation of an input signal $V_{IN}$. In the context of this description, the term "peak" refers to a maximum voltage or a measure of amplitude of an oscillation of a signal. The term "peak" may be used interchangeably with "peak voltage," "amplitude," "maximum voltage," and other related terms.

The peak detector 300 includes a transistor 302 with a drain terminal DRN, a gate terminal GT, and a source terminal SRC. The transistor 302 may be a field-effect transistor (FET), such as a metal-oxide-semiconductor (MOS) FET (MOSFET), for example. In FIG. 3, the transistor 302 is an N-type MOSFET (NFET) but may alternatively be a P-type FET. The drain terminal DRN receives a supply voltage VDD. The source terminal SRC is coupled to an output node 304, on which the peak signal $V_{PK}$ is generated. The source terminal SRC is also coupled to a current source 306 and a capacitor 308. The current source 306 and the capacitor 308 are also coupled to a reference voltage VSS (e.g., ground). An alternating current (AC) signal, or oscillating signal, is provided to the gate terminal GT as an input signal $V_{IN}$.

In this configuration, the peak detector 300 may be referred to as a source follower circuit in which a voltage at the source terminal SRC of the transistor 302 follows a voltage of the input signal $V_{IN}$ minus a gate to source voltage $V_{GS}$ of the transistor 302. As the input signal $V_{IN}$ voltage increases, the source terminal SRC follows with a difference of the gate to source voltage $V_{GS}$. Since the source terminal SRC is coupled to the capacitor 308, the capacitor 308 is charged to the highest voltage level (i.e., peak) reached by the source terminal SRC. Thus, the output node 304 also rises to the peak voltage $V_{PK}$ of the input signal $V_{IN}$ minus the gate to source voltage $V_{GS}$. A relationship between the input signal $V_{IN}$, the source terminal SRC, and the peak signal $V_{PK}$ is also illustrated in FIG. 3. As shown, the source terminal SRC corresponds to the input signal $V_{IN}$ but is lower than the input signal $V_{IN}$ by a difference equal to the gate to source voltage $V_GS$ between the gate terminal GT and the source terminal SRC. A voltage $V_{SRC}$ of the source terminal SRC is less than the input signal $V_{IN}$ on the gate terminal by the gate to source voltage $V_{GS}$. As shown here, the peak signal $V_{PK}$ on the output node 304 slowly decreases as the input signal $V_{IN}$ drops off. The slow decrease in the peak signal $V_{PK}$ is caused by the current source 306 draining charge from the capacitor 308. Without the current source 306, the capacitor 308 would remain charged to the maximum applied voltage. If the amplitude of the input signal $V_{IN}$ decreases in subsequent oscillations, the peak signal $V_{PK}$ would continue to show the voltage to which the capacitor 308 is charged and would not correspond to the lower peak voltages in the subsequent oscillations.

Although operating characteristics of the transistor 302 may vary from chip to chip due to manufacturing process corners, it has been found that even devices from different process corners demonstrate similar output characteristics in response to a large enough AC input amplitude. The AC input amplitude at the gate terminal GT of the transistor 302 is determined by a ratio of the capacitance of a coupling capacitor $C_{AC}$ and the load capacitance $C_G$ of the transistor 302.

Figure 4:
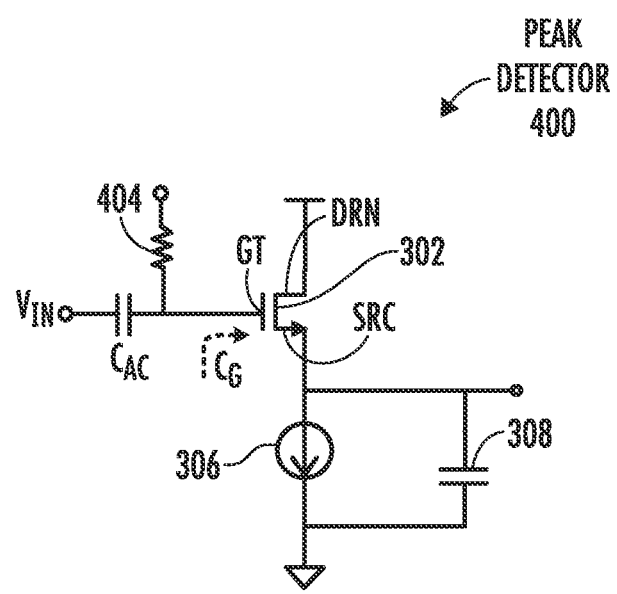
FIG. 4 is a schematic diagram of a source follower circuit, including a coupling capacitor circuit for illustrating the ratios needed for a high amplitude AC input to reduce output variations across process corners.

FIG. 4 is a schematic diagram of a peak detector 400, including the peak detector 300 in FIG. 3 with the addition of the coupling capacitor $C_{AC}$ and resistor 404. The load capacitance $C_G$ of the transistor 302 is based on capacitances between the gate terminal GT and the drain terminal DRN, the source terminal SRC, and the body (not shown) of the transistor 302, for example.

As noted, the AC input amplitude is based on a ratio of the coupling capacitance $C_{AC}$ to a sum of the coupling capacitance $C_{AC}$ plus the load capacitance $C_G$ (e.g., $C_{AC}/(C_{AC}+C_G)$). For this reason, a transistor that is smaller in size and with a smaller load capacitance $C_G$ is preferred for achieving a higher AC input amplitude. However, as devices (e.g., transistors) decrease in size, minor manufacturing variations can cause relatively large performance variations from one to another, resulting in a performance mismatch from one peak detector to another. This type of mismatch can cause differences in operation from one device (e.g., VCO, PLL, or transmitter) to another.

For this reason, the peak detector 500 shown in FIG. 5A includes multiple amplitude detection circuits 502(1)-502(N). The amplitude detection circuits 502(1)-502(N) may be referred to herein as a group as "amplitude detection circuits 502." In addition, unless a particular one in the range (1)-(N) is being discussed, any individual one of the amplitude detection circuits 502 may be referred to generally as an "amplitude detection circuit 502." Such naming conventions are also used herein for other features having numbered ranges below.

The amplitude detection circuits 502 vary in performance, such that there is a distribution (e.g., random distribution) of performance characteristics among the multiple amplitude detection circuits 502. In an IC where the voltages of multiple amplitude detection circuits are averaged together, the result has much less variation from the result of another IC of this type than would occur when comparing results of peak detectors in two ICs that each includes a single amplitude detection circuit. This improvement can be measured as a much lower standard deviation in the average of multiple amplitude detection devices than the standard deviation from a single amplitude detection circuit. In the example in FIG. 5A, there are N amplitude detection circuits. The number N may be any number, such as in the range from 2 to 100, or more, for example. Operation of the amplitude detection circuits 502 is explained further below, following a circuit description.

With further reference to FIG. 5A, the amplitude detection circuits 502 are coupled in parallel to signal inputs 506N and 506P. Each amplitude detection circuit 502 includes a first sense circuit 508N coupled to the signal input 506N and a second sense circuit 508P coupled to the signal input 506P. In this example, the first and second sense circuits 508N and 508P are transistors coupled between a supply voltage source 510 (e.g., a power rail) providing a supply voltage VDD and an output 512. The output 512 is also coupled to a capacitor 514 and a current source 516. The outputs 512 of the amplitude detection circuits 502(1)-502(N) are also referred to as outputs 512(1)-512(N). Within each amplitude detection circuit 502, the capacitor 514 and the current source 516 are also coupled to a reference voltage source 518 supplying a reference voltage VSS (e.g., ground). In this example, the signal inputs 506N and 506P are coupled to outputs 520N and 520P of a VCO 522. The outputs 520N and 520P provide an output $V_{OUT}$ from the VCO 522 as a voltage differential between voltages signals VCO– and VCO+. Thus, the signal inputs 506N and 506P receive the output $V_{OUT}$ as an input signal $V_{IN}$.

The amplitude detection circuits 502(1)-502(N) generate voltages $V_{PK}(1)$-$V_{PK}(N)$ (not shown) on the outputs 512(1)-512(N) based on an amplitude of the input signal $V_{IN}$ received on the signal inputs 506N and 506P. As explained below with reference to FIGS. 7 and 8, individual ones of the amplitude detection circuits 502(1)-502(N) are activated one at a time under the control of a control circuit 528. That is, all but one of the amplitude detection circuits 502 may be inactive, while one activated amplitude detection circuit 502 captures the peak voltage $V_{PK}$ on its output 512. The amplitude detection circuits 502 may be activated (one at a time) sequentially (or in another order) until each one has stored or captured a peak voltage $V_{PK}$. Alternatively, an average voltage may be based on peak voltages $V_{PK}$ of less than all of the amplitude detection circuits 502(1)-502(N).

To activate the amplitude detection circuits 502 individually, each includes a first input switch 530N coupled to the first signal input 506N and a second input switch 530P coupled to the second signal input 506P. The first and second input switches 530N, 530P are controlled by the control circuit 528 to close when the amplitude detection circuit 502 is active and open when it is inactive. The control circuit 528 closes both of the first input switch 530N and the second input switch 530P in each of the plurality of amplitude detection circuits 502, one amplitude detection circuit 502 at a time, sequentially. The control circuit 528 may include hardware logic circuits and storage elements for sequential control of the plurality of amplitude detection circuits 502.

For example, the first and second input switches 530N, 530P of amplitude detection circuit 502(1) may be closed to activate the amplitude detection circuit 502(1) for one or more cycles of the input signal $V_{IN}$. When the first and input second switches 530N, 530P of amplitude detection circuit 502(1) are opened, a peak voltage $V_{PK}$ is stored on the capacitor 514 and may be detected on the output 512. Next, the first and second input switches 530N, 530P of amplitude detection circuit 502(2) may be closed to activate the amplitude detection circuit 502(2), and so on through amplitude detection circuit 502(N). Alternatively, the amplitude detection circuits 502 may be activated in any order, and/or less than all of the amplitude detection circuits 502 may be activated in a sequence.

The amplitude detection circuit 502 includes a first resistor-capacitor (RC) circuit 532N that is coupled to the first signal input 506N when the first input switch 530N is closed and a second RC circuit 532P coupled to the second signal input 506P when the second input switch 530P is closed. The first and second RC circuits 532N, 532P provide the coupling capacitances $C_{AC}$ that determines, in conjunction with the load capacitances $C_G$ of the first and second sense circuits 508N and 508P, the AC input amplitude to 508N and 508P. Variations between peak detectors 500 in different devices (e.g., VCOs, PLL, transmitters) can be reduced by keeping the AC input amplitudes to sense circuits 508N and 508P at a high level.

With further regard to the amplitude detection circuit 502, the first sense circuit 508N comprises a first transistor 534N, such as a field-effect transistor (FET), which may be a metal-oxide-semiconductor (MOS) FET (MOSFET). The first transistor 534N includes a gate G1 coupled to the first signal input 506N, a first source/drain D1 coupled to the supply voltage source 510, and a second source/drain S1 coupled to the output 512. The second sense circuit 508P comprises a second transistor 534P, which includes a gate G2 coupled to the second signal input 506P, a first source/drain D2 coupled to the supply voltage source 510, and a second source/drain S2 coupled to the output 512. As noted above, the capacitor 514 is coupled to the output 512 and the reference voltage source 518, and the current source 516 is coupled to the output 512 and the reference voltage source 518. Configured in this manner, the amplitude detection circuit 502 may be recognized as a source follower circuit, in which a voltage $V_{PK}$ provided to the capacitor 514 and the output 512 is the same as a voltage of the input signals VCO− and VCO+ minus a voltage drop (e.g., gate to source voltage $V_{GS}$) between the gate G1 and the second source/drains S1 or between the gate G2 and the second source/drain S2.

It is noted that the term "coupled" used herein refers to electrical coupling, which may include an indirect or direct electrically conductive coupling, which may be an electrically conductive connection, and may include a mechanical connection.

Figure 5:
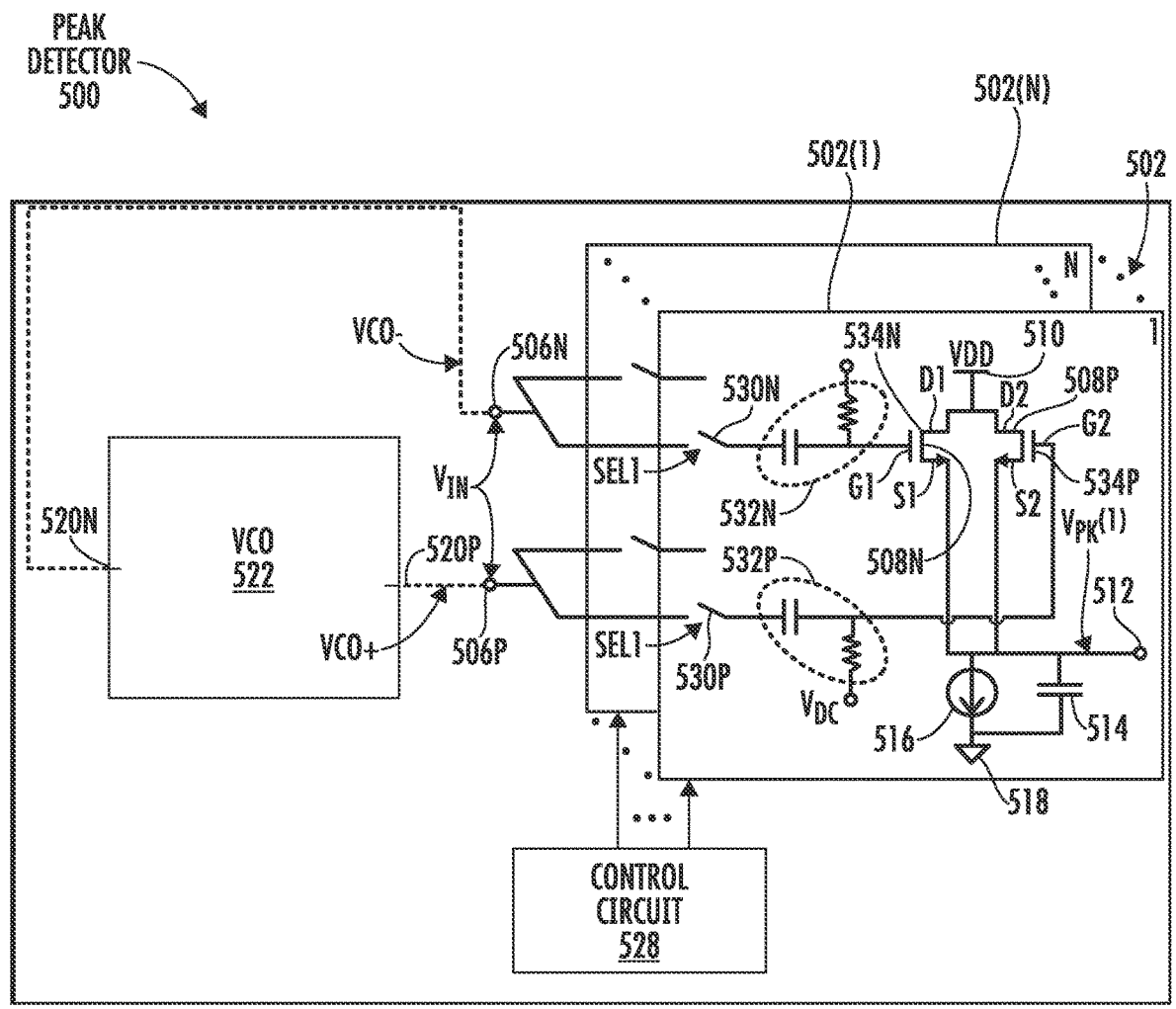
FIG. 5 is a schematic diagram of an example of an exemplary peak detector in which each of the amplitude detection circuits includes a capacitive coupling circuit.
Figure 6:
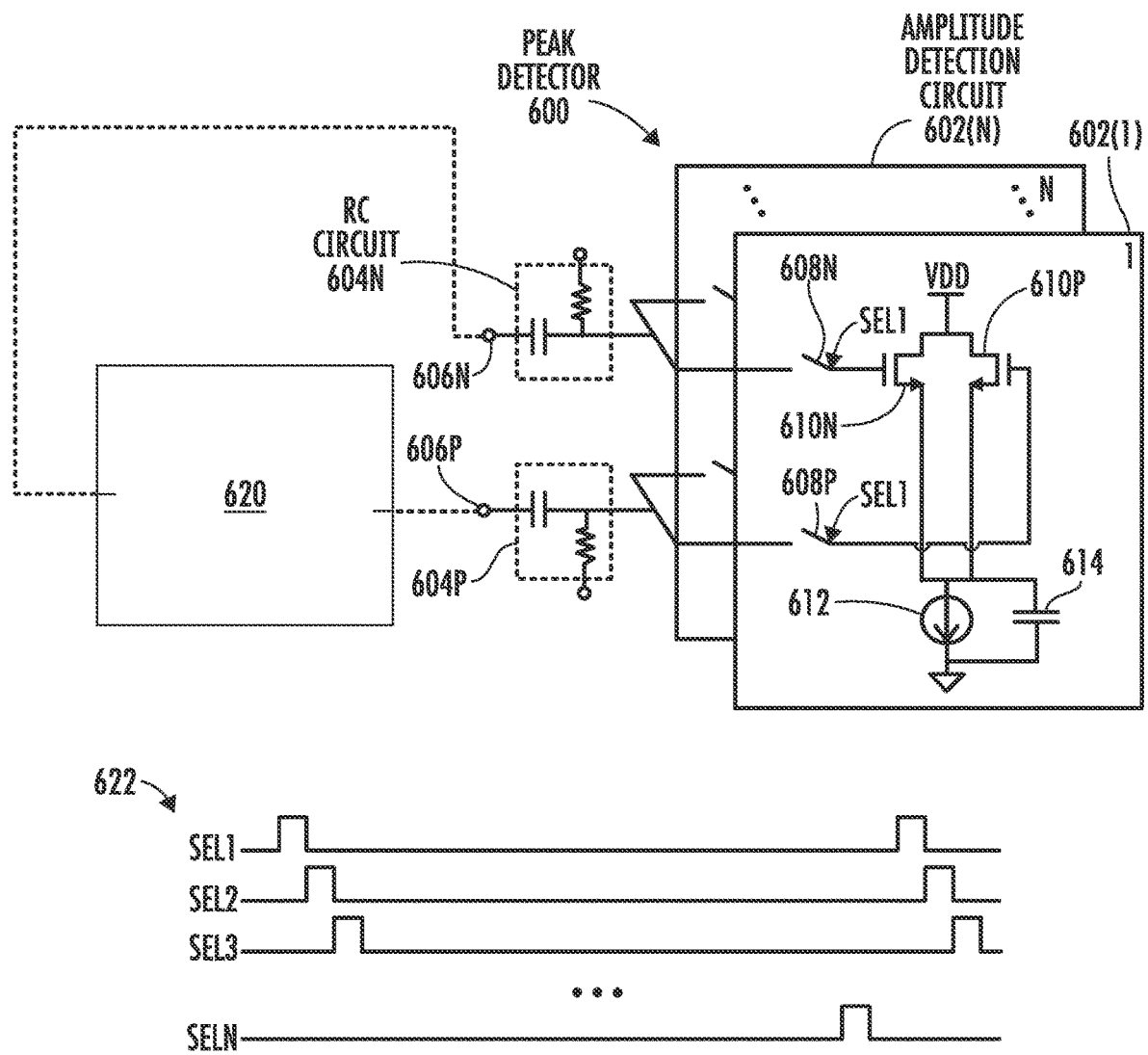
FIG. 6 is a schematic diagram of another example of an exemplary peak detector and timing diagram illustrating sharing one capacitive coupling circuit among each of the amplitude detection circuits sequentially.

FIG. 6 is a schematic diagram of a peak detector 600 in another example of a peak detector tolerant to process variation and mismatch, including multiple (e.g., a plurality of) amplitude detection circuits 602(1)-602(N) to reduce a standard deviation of the peak detector 600. Operation of the peak detector 600 is the same as the peak detector 500 in FIG. 5 and will not be described again here. The structure of the peak detector 600 differs from the peak detector 500 only in the following aspects.

Rather than including two RC coupling circuits in each of the amplitude detection circuits 602, which is the case in the amplitude detection circuits 502 in FIG. 5, the peak detector 600 includes only a first RC coupling circuit 604N and a second RC coupling circuit 604P that can be used with each of the amplitude detection circuits 602(1)-602(N) because they are activated one at a time. The RC coupling circuit 604N is coupled to a first signal input 606N and to a first input switch 608N in each of the amplitude detection circuits 602. The RC coupling circuit 604P is coupled to a second signal input 606P and to a second input switch 608P in each of the amplitude detection circuits 602. The first signal input 606N and the second signal input 606P are coupled to a signal generating circuit 620, which may be a VCO of a PLL. When the first and second input switches 608N, 608P are closed to activate one of the amplitude detection circuits 602 (e.g., sequentially), the first and second RC coupling circuits 604N and 604P are employed. Using the RC coupling circuits 604N and 604P with each of the amplitude detection circuits 602, one at a time, in this manner, the total number of RC coupling circuits in the peak detector 600 is reduced from 2×N to two (2). Each amplitude detection circuit includes a first sense circuit 610N, a second sense circuit 610P, a current source 612, and a capacitor 614.

Figure 7:
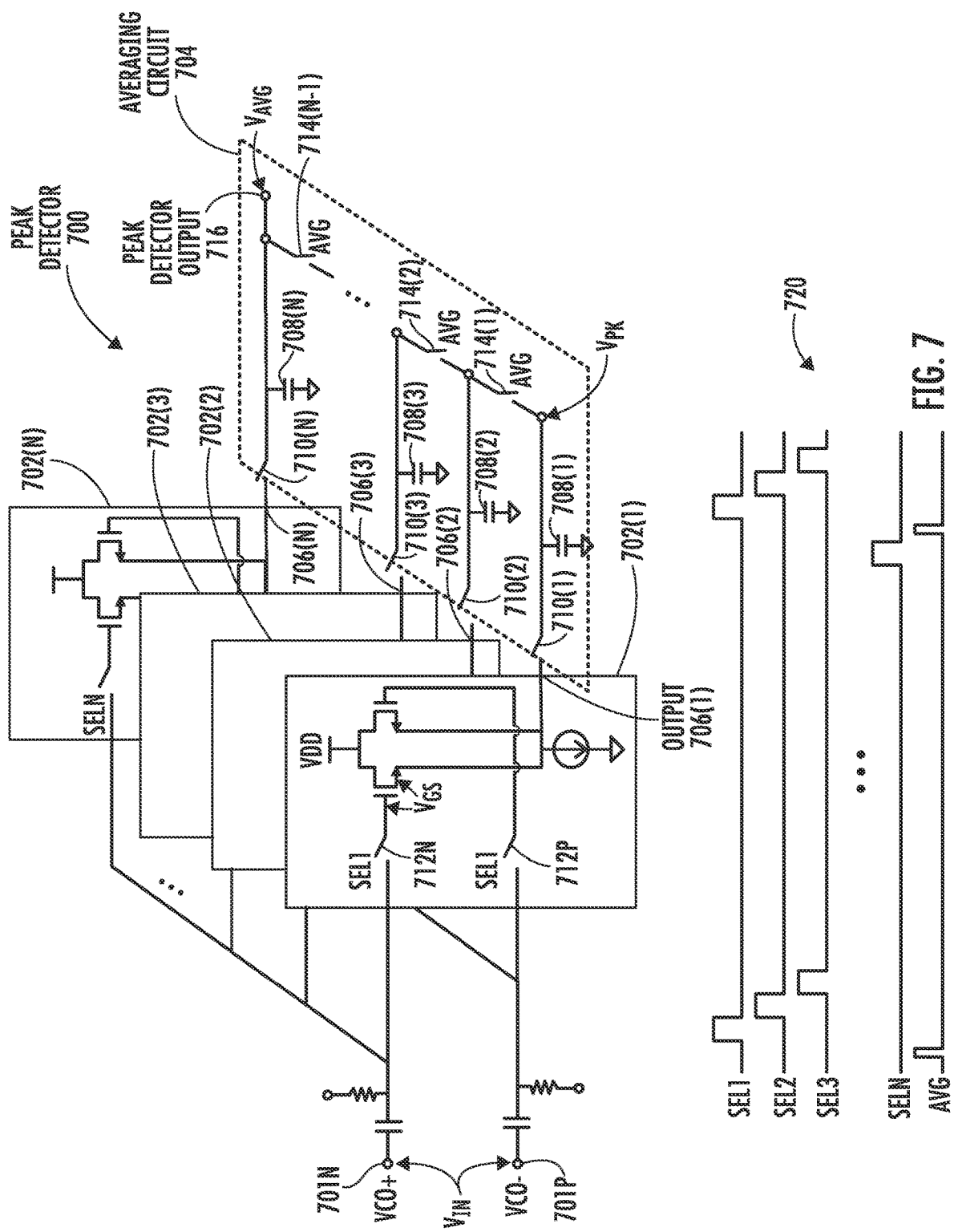
FIG. 7 is a schematic diagram of the exemplary peak detector in FIG. 6 coupled to a first example of an averaging circuit for averaging the voltages generated in each of the amplitude detection circuits.
Figure 8:
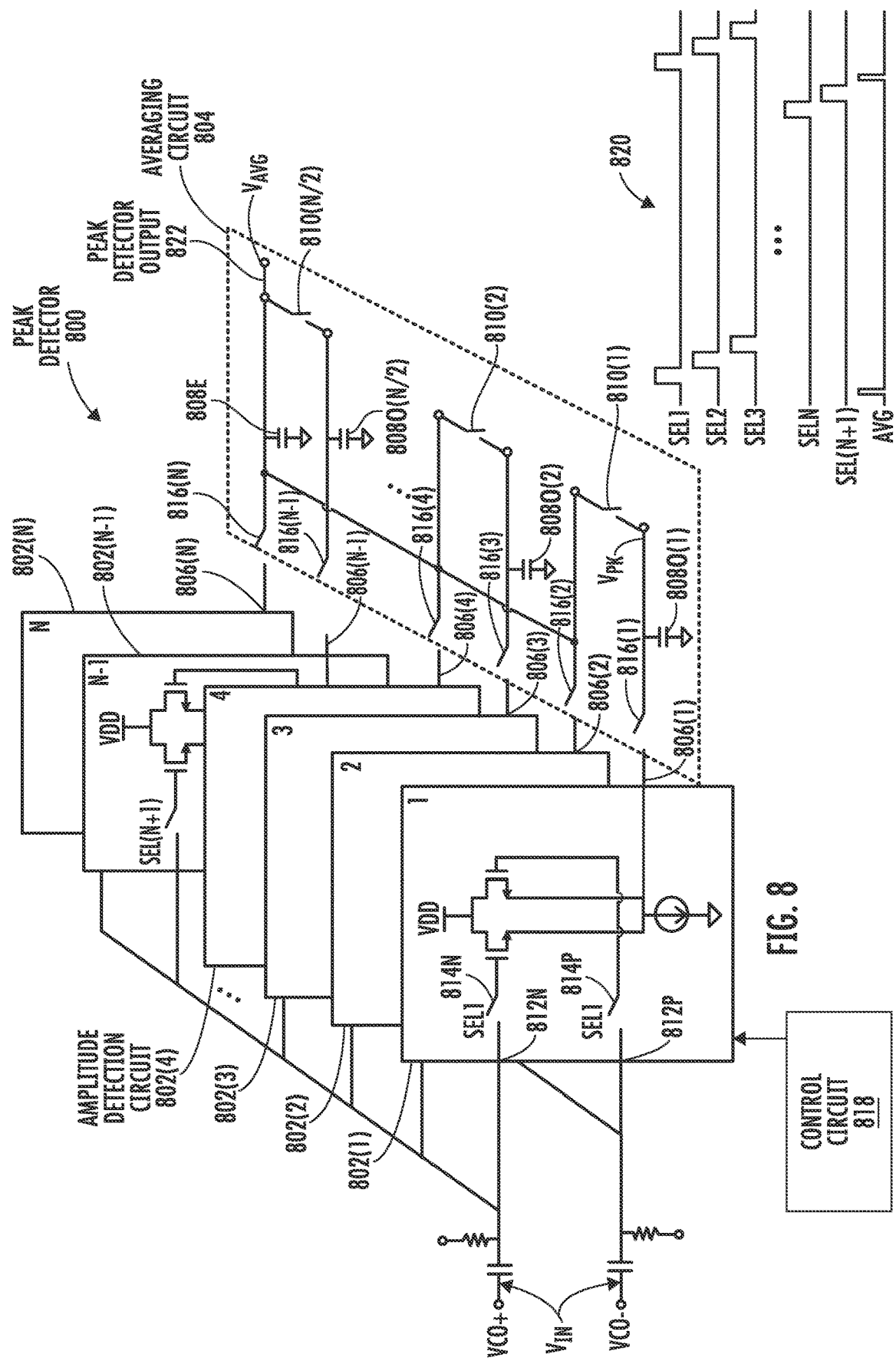
FIG. 8 is a schematic diagram illustrating another view of the exemplary peak detector in FIG. 6 coupled to another example of an averaging circuit employing fewer capacitors among amplitude detection circuits than the example in FIG. 7.

FIG. 6 also includes a timing diagram 622 showing the states of control signals SEL1, SEL2, SEL3, and SELN generated by a control circuit, such as control circuit 528, for example, to control the input switches 608N, 608P, to activate the amplitude detection circuits 602(1), 602(2), 602(3), and 602(N) sequentially (amplitude detection circuits 602(2) and 602(3) are not shown). After activating amplitude detection circuits 602(1)-602(N), the process starts again at amplitude detection circuits 602(1), after the average process described below with reference to FIGS. 7 and 8. FIGS. 7 and 8 both include a peak detector corresponding to the peak detector 600 but include different examples of averaging circuits that may be employed to generate an average voltage that is an average of the peak voltages $V_{PK}$ captured by the amplitude detection circuits 602.

FIG. 7 is a schematic diagram of a peak detector 700 that may be coupled to a VCO (not shown) at signal inputs 701N and 701P. As noted, the peak detector 700 includes all the features of the peak detector 600 and further includes multiple amplitude detection circuits 702. The peak detector 700 also includes an averaging circuit 704 with which an average voltage $V_{AVG}$ can be generated by averaging outputs 706 of the amplitude detection circuits 702. Because the average voltage $V_{AVG}$ is generated by a plurality of amplitude detection circuits 702 of the peak detector 700, it has a lower standard deviation than a peak voltage $V_{PK}$ generated by a peak detector having only one amplitude detection circuit.

The amplitude detection circuits 702(1)-702(N) have corresponding outputs 706(1)-706(N) on which a peak voltage $V_{PK}$ is generated based on the maximum voltage of an input signal $V_{IN}$ received on the signal inputs 701N, 701P. The averaging circuit 704 includes capacitors 708(1)-708(N), each coupled to the output 706 of one of the amplitude detection circuits 702(1)-702(N) by output switches 710(1)-710(N). Specifically, the capacitor 708(1) is coupled to the output 706(1) by the output switch 710(1), the capacitor 708(2) is coupled to the output 706(2) by the output switch 710(2), and so on including the capacitor 708(N) coupled to the output 706(N) by the output switch 710(N). Thus, the capacitor 708(1) is charged to the peak voltage $V_{PK}$ detected on the input signal $V_{IN}$, minus a gate to source voltage $V_{GS}$ ($V_{PK}=V_{IN}-V_{GS}$), when the amplitude detection circuit 702(1) is activated by closing its input switches 712N and 712P and the output switch 710(1) by SEL1.

The averaging circuit 704 also includes averaging switches 714(1)-714(N−1), each coupled to the outputs 706 of two of the amplitude detection circuits 702(1)-702(N). For example, the averaging switch 714(1) is coupled between the output 706(1) and the output 706(2), the averaging switch 714(2) is coupled between the output 706(2) and the output 706(3), and so on including the averaging switch 714(N−1) coupled between the output 706(N−1) and the output 706(N). Therefore, the averaging switches 714(1)-714(N−1) are coupled in series to couple each of the outputs 706(1)-706(N) of the amplitude detection circuits 702(1)-702(N) to a peak detector output 716. The peak detector output 716 is coupled to the output 706(N) in the example in FIG. 7 but may be coupled to any one of the outputs 706(1)-706(N).

During a charging phase, as shown in the timing diagram 720, each amplitude detection circuit 702 is activated one at a time as the switch select signals SEL1-SELN are sequentially activated to charge their corresponding capacitors 708(1)-708(N). For example, the switch select signal SEL1 is activated to close the input switches 712N, 712P, and the output switch 710(1) of the amplitude detection circuit 702(1). After a predetermined time, which may correspond to one or more cycles of the input signal $V_{IN}$, the switch select signal SEL1 is deactivated to open the input switches 712N, 712P, and the output switch 710(1) of the amplitude detection circuit 702(1) and the switch signal SEL2 is activated to close the input switches 712N, 712P and the output switch 710(2) of the amplitude detection circuit 702(2).

During the charging phase, the averaging switches 714(1)-714(N−1) remain open to electrically isolate the capacitors 708(1)-708(N) from each other. After the charging phase, when all the capacitors 708(1)-708(N) have been charged, the output switches 710(1)-710(N) remain open when the averaging switches 714(1)-714(N−1) are closed. A pulse signal AVG is generated (e.g., by a control circuit not shown here) to shortly close the averaging switches 714(1)-714(N−1) to couple the capacitors 708(1)-708(N) to each other and to the peak detector output 716. Closing all the averaging switches 714(1)-714(N−1) causes all the capacitors 708(1)-708(N) to be coupled in parallel, redistributing their charges and creating an average voltage $V_{AVG}$ that is an average of all the stored peak voltages $V_{PK}$. The average voltage $V_{AVG}$ can be detected on the peak detector output 716.

Assuming each amplitude detection circuit 702 has some error due to process variation, the respective errors may be random. Thus, the effect of each individual error is reduced as the respective errors offset each other when averaged together. The theoretical RMS error of $V_{AVG}$ can be improved by a factor of $\sqrt{N}$ compared to each $V_{PK}$ (due to random and uncorrelated variations). After the averaging pulse AVG, the input switches 712N and 712P of one of the amplitude detection circuits 702 is closed to begin a new charging cycle.

FIG. 8 is a schematic diagram of a peak detector 800, including the peak detector 600 in FIG. 6, coupled to another example of an averaging circuit employing about half the capacitors of peak detector 700 in FIG. 7. The peak detector 800 includes amplitude detection circuits 802(1)-802(N), where N is an even number. The amplitude detection circuits 802(1)-802(N) include odd amplitude detection circuits 802(1), 802(3), 802(5) . . . 802(N−1) ("odd amplitude detection circuits 802O") and even amplitude detection circuits 802(2), 802(4), 802(6) . . . 802(N) ("even amplitude detection circuits 802E").

The peak detector 800 includes an averaging circuit 804 coupled to outputs 806(1)-806(N) of the amplitude detection circuits 802(1)-802(N). Like the averaging circuit 704 in FIG. 7, the averaging circuit 804 is also employed to average the charges captured by each amplitude detection circuit 802(1)-802(N). However, rather than having N capacitors, the averaging circuit 804 includes only N/2+1 capacitors, which are odd capacitors 808O(1)-808O(N/2) and even capacitor 808E, as follows. Each one of the odd capacitors 808O(1)-808O(N/2) is coupled to the output 806 of one of the odd amplitude detection circuits 802O. The even capacitor 808E can be coupled to the output 806 of any one of the even amplitude detection circuits 802E.

Restating for clarity, the output 806 of every odd amplitude detection circuit 802O is coupled to a respective one of the odd capacitors 808O(1)-808O(N/2). The outputs 806 of all the even amplitude detection circuits 802E can be coupled to the even capacitor 808E. Thus, the averaging circuit 804 includes about half (i.e., N/2−1 fewer) the number of capacitors used in the averaging circuit 704 in FIG. 7.

The averaging circuit 804 also includes averaging switches 810(1)-810(N/2), which are each coupled to the outputs 806 of one of the odd amplitude detection circuits 802O and a corresponding one of the even amplitude detection circuits 802E. For example, the averaging switch 810(1) is coupled to the outputs 806(1) of the amplitude detection circuits 802(1), and the output 806(2) of the amplitude detection circuit 802(2), the averaging switch 810(2) is coupled to the outputs 806(3)-806(4) of the amplitude detection circuits 802(3) and 802(4), and the averaging switch 810(N/2) is coupled to the outputs 806(N−1)-806(N) of the amplitude detection circuits 802(N−1) and 802(N).

To couple the amplitude detection circuits 802 to signal inputs 812N, 812P to receive the input signal $V_{IN}$, each amplitude detection circuit 802 includes input switches 814N, 814P, which correspond to the input switches 712N, 712P in FIG. 7. To selectively couple to the outputs 806 of the amplitude detections circuits 802, the averaging circuit 804 includes output switches 816(1)-816(N). In the charging phase of the peak detector 800, the input switches 814N, 814P, and the output switch 816 operate in the same manner as the input switches 712N, 712P, and the output 710 in the charging phase of the peak detector 700, described previously. In addition, the averaging circuit 804 is also controlled during the charging phase, as in the following example.

With reference to the timing diagram 820, the voltage averaging is performed in pairs of odd and even amplitude detection circuits 808O,808E, starting with the amplitude detection circuits 802(1)-802(2). The control circuit 818 activates the switch signal SEL1 to close the input switches 814N, 814P, and the output switch 816(1) to charge the capacitor 808(1) to a voltage $V_{PK}$ (as described above). During this time, the averaging switch 810(1) is open. The input switches 814N, 814P, and output switches 816(2)-816(N) of all the other amplitude detection circuits 802 are also open.

Next, the control circuit 818 deactivates the switch signal SEL1 to open the input switches 814N, 814P, and the output switch 816(1), and activates the switch signal SEL2 to close the input switches 814N, 814P, and the output switch 816(2) of the amplitude detection circuit 802(2). Since the amplitude detection circuit 802(2) is one of the even amplitude detection circuits, the output switch 816(2) couples the output 806 to the capacitor 808E, which is charged to the peak voltage $V_{PK}$ of the input signal $V_{IN}$ detected at the signal inputs 812N, 812P. After a predetermined time, which may include several cycles of the input signal $V_{IN}$, the control circuit 818 deactivates the switch signal SEL2 to open the input switches 814N, 814P, and the output switch 816(2) of the amplitude detection circuit 802(2).

The control circuit 818 then activates the switch signal SEL3, which closes the averaging switch 810(1), coupling the odd capacitor 808O(1) to the even capacitor 808E. In this manner, charges are distributed between the odd capacitor 808O(1) and the even capacitor 808E, and an average voltage $V_1$ of the respective peak voltages $V_{PK}$ detected by the amplitude detection circuits 802(1)-802(2) is stored in the odd capacitor 808O(1). Next, the switch signal SEL3 is deactivated to open the averaging switch 810(1).

The process moves to the next pair of odd and even amplitude detection circuits 802(3) and 802(4). As described above, the input switches 814N, 814P, and the output switch 816 in the amplitude detection circuit 802(3) are closed to store a peak voltage $V_{PK}$ on the odd capacitor 808O(2). The amplitude detection circuit 802(4) stores a peak voltage $V_{PK}$ on the even capacitor 808E and then opens. Then the averaging switch 810(2) is closed to store an average voltage $V_2$ of the respective peak voltages $V_{PK}$ of the odd capacitor 808O(2) and the even capacitor 808E.

This process proceeds with pairs of odd and even amplitude detection circuits 802 until the select signals SELN−1 and SELN are activated to control the amplitude detection circuits 802(N−1) and 802(N) to store peak voltages $V_{PK}$. In response to the odd capacitor 808O(N/2) stores the average voltage $V_{N/2}$. The average voltage $V_{N/2}$ is an average of the peak voltage $V_{PK}$ stored on the odd capacitor 808O(N/2) by the amplitude detection circuit 802(N−1) and the peak voltage $V_{PK}$ stored on the even capacitor 808E by the amplitude detection circuit 802(N).

The average voltage $V_{AVG}$ of all the peak voltages $V_{PK}$ detected by all the amplitude detection circuits 802 is coupled to a peak detector output 822 when the control circuit 818 activates the switch signal AVG. The switch signal AVG couples all of the odd capacitors 808O(1)-808O(N/2) to the even capacitor 808E, producing the average voltage $V_{AVG}$ by charge distribution. The peak detector 800 has the same RMS error improvement on $V_{AVG}$ (i.e., by a factor of $V_{IN}$) as peak detector 700, but it employs only about half the number of sampling capacitors (i.e., N/2−1).

It should be understood that a peak detector including an odd number of amplitude detection circuits may be employed with an obvious modification of the circuit described above.

Operation of the averaging circuit 804 may be more clearly understood with reference to FIGS. 9A-9D. In FIG. 9A, the amplitude detection circuit 802(1) is coupled to the odd capacitor 808O(1) by closing the output switch 816(1) while the averaging switch 810(1) is open. During this state, a peak voltage $V_{PK}$ detected by the amplitude detection circuit 802(1) is stored on the odd capacitor 808O(1). In FIG. 9B, the amplitude detection circuit 802(1) is decoupled from the odd capacitor 808O(1) by opening the output switch 816(1), and the amplitude detection circuit 802(2) is coupled to the even capacitor 808E by closing the output switch 816(2) to store a peak voltage $V_{PK}$ on the even capacitor 808E. The averaging switch 810(1) remains open.

In FIG. 9C, the amplitude detection circuit 802(2) is decoupled from the even capacitor 808E by opening the output switch 816(2), and the averaging switch 810(1) is closed to store the average voltage $V_1$ on the odd capacitor 808O(1).

In this manner, for each of the odd amplitude detection circuits 802O(1)-802O(N/2), the control circuit 818 closes the averaging switch 810 coupled to the odd capacitor 808O.

As shown in FIG. 9D, after the remaining odd capacitors 808O(2)-808O(N/2) are similarly operated to store the average voltages $V_2$-$V_{N/2}$, the output switches 816(1)-816(N) of all the amplitude detection circuits 802 remain open while all the averaging switches 810(1)-810(N/2) are closed to provide the average voltage $V_{AVG}$ of all the amplitude detection circuits 802 on the peak detector output 822.

FIG. 10 is a flowchart illustrating a method 1000 of detecting a peak voltage of an input signal employing the peak detectors 700 and 800 in FIGS. 7 and 8. The method includes in a peak detector 700, 800 comprising a plurality of amplitude detection circuits 702, 802 coupled in parallel to a first signal input 701N, 812N, and a second signal input 701P, 812P, each of the plurality of amplitude detection circuits 702, 802 comprising an output 706, 806, an averaging circuit 704, 804 coupled to the output 706, 806 of each of the plurality of amplitude detection circuits 702, 802 and a peak detector output 716, 822, generating, on the output 706, 806 of each of the plurality of amplitude detection circuits 702, 802, a peak voltage $V_{PK}$ indicating an amplitude of an input signal $V_{IN}$ received on the first signal input 701N, 812N and the second signal input 701P, 812P (block 1002). Generating the peak voltage $V_{PK}$ on the output 706, 806 of each of the amplitude detection circuits 702, 802 may include coupling each of the plurality of amplitude detection circuits 702, 802, one at a time, sequentially, to the first signal input 701N, 812N, and the second signal input 701P, 812P (block 1004). The method includes generating, on the peak detector output 716, 822, an average voltage $V_{AVG}$ comprising an average of the peak voltages $V_{PK}$ on the outputs 706, 806, of the plurality of amplitude detection circuits 702, 802 (block 1006), which may further comprise coupling the outputs 706, 806, of the plurality of amplitude detection circuits 702, 802 to the peak detector output (1008).

FIG. 11 is a block diagram of an exemplary processor-based system 1100 that includes a processor 1102 (e.g., a microprocessor) that includes an instruction processing circuit 1104. The processor-based system 1100 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 1100 includes the processor 1102. The processor 1102 represents one or more general-purpose processing circuits, such as a microprocessor, central processing unit, or the like. More particularly, the processor 1102 may be an EDGE instruction set microprocessor or other processor implementing an instruction set that supports explicit consumer naming for communicating produced values resulting from execution of producer instructions. The processor 1102 is configured to execute processing logic in instructions for performing the operations and steps discussed herein. In this example, the processor 1102 includes an instruction cache 1106 for temporary, fast access memory storage of instructions accessible by the instruction processing circuit 1104. Fetched or prefetched instructions from a memory, such as a main memory 1108, over a system bus 1110, are stored in the instruction cache 1106. Data may be stored in a cache memory 1112 coupled to the system bus 1110 for low-latency access by the processor 1102. The instruction processing circuit 1104 is configured to process instructions fetched into the instruction cache 1106 and process the instructions for execution.

The processor 1102 and the main memory 1108 are coupled to the system bus 1110 and can intercouple peripheral devices included in the processor-based system 1100. As is well known, the processor 1102 communicates with these other devices by exchanging address, control, and data information over the system bus 1110. For example, the processor 1102 can communicate bus transaction requests to a memory controller 1114 in the main memory 1108 as an example of a slave device. Although not illustrated in FIG. 11, multiple system buses 1110 could be provided; wherein each system bus 1110 constitutes a different fabric. In this example, the memory controller 1114 is configured to provide memory access requests to a memory array 1116 in the main memory 1108. The memory array 1116 is comprised of an array of storage bit cells for storing data. The main memory 1108 may be a read-only memory (ROM), flash memory, dynamic random-access memory (DRAM), such as synchronous DRAM (SDRAM), etc., and/or static memory (e.g., flash memory, SRAM, etc.), as non-limiting examples.

Other devices can be connected to the system bus 1110. As illustrated in FIG. 11, these devices can include the main memory 1108, one or more input device(s) 1118, one or more output device(s) 1120, a modem 1122, and one or more display controllers 1124, as examples. The input device(s) 1118 can include any type of input device, including but not limited to input keys, switches, voice processors, etc. The output device(s) 1120 can include any type of output device, including but not limited to audio, video, other visual indicators, etc. The modem 1122 can be any device configured to allow exchange of data to and from a network 1126. The network 1126 can be any type of network, including but not limited to a wired or wireless network, a private or public network, a local area network (LAN), a wireless local area network (WLAN), a wide area network (WAN), a BLUETOOTH™ network, and the Internet. The modem 1122 can be configured to support any type of communications protocol desired. The processor 1102 may also be configured to access the display controller(s) 1124 over the system bus 1110 to control information sent to one or more displays 1128. The display(s) 1128 can include any type of display, including but not limited to a cathode ray tube (CRT), a liquid crystal display (LCD), a plasma display, etc.

The processor-based system 1100 in FIG. 11 may include a set of instructions 1130 to be executed by the processor 1102 for any application desired according to the instructions. The instructions 1130 may be stored in the main memory 1108, processor 1102, and/or instruction cache 1106 as examples of a non-transitory computer-readable medium 1132. The instructions 1130 may also reside, completely or at least partially, within the main memory 1108 and/or within the processor 1102 during their execution. The instructions 1130 may further be transmitted or received over the network 1126 via the modem 1122, such that the network 1126 includes computer-readable medium 1132.

Any of the circuits in the processor-based system 1100, and in particular the modem 1122 and the output devices 1120, may include a peak detector 700, 800, including a plurality of amplitude detection circuits coupled in parallel to generate an average voltage with a lower standard deviation, as illustrated in FIGS. 7 and 8. Any of the circuits in the processor-based system 1100, such as the modem 1122, may include a phase-locked loop (PLL), including a voltage-controlled oscillator with a peak detector 700, 800.

While the computer-readable medium 1132 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the systems described herein may be employed in any circuit, hardware component, integrated circuit (IC), or IC chip, for example. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A peak detector, comprising:
   a plurality of amplitude detection circuits coupled in parallel to a first signal input and a second signal input, each of the plurality of amplitude detection circuits configured to generate, on an output, a peak voltage indicating an amplitude of an input signal received on the first signal input and the second signal input;
   an averaging circuit coupled to the output of each of the plurality of amplitude detection circuits, the averaging circuit configured to generate, on a peak detector output, an average voltage comprising an average of the peak voltages on the outputs of the plurality of amplitude detection circuits;
   wherein each of the plurality of amplitude detection circuits comprises:
      a first input switch coupled to the first signal input;
      a second input switch coupled to the second signal input; and
      an output switch coupled to the output.

2. The peak detector of claim 1, each of the plurality of amplitude detection circuits comprises:
   a first sense circuit configured to generate the peak voltage on the output based on the input signal received on the first input signal; and
   a second sense circuit configured to generate the peak voltage on the output based on the input signal received on the second input signal.

3. The peak detector of claim 2, wherein
   the first sense circuit comprises a first transistor comprising:
      a gate coupled to the first signal input;
      a first source/drain coupled to a supply voltage source; and
      a second source/drain coupled to the output;
   the second sense circuit comprises a second transistor comprising:
      a gate coupled to the second signal input;
      a first source/drain coupled to the supply voltage source; and
      a second source/drain coupled to the output; and
   each of the plurality of amplitude detection circuits further comprises:
      a capacitor coupled to the output and a reference voltage source; and
      a current source coupled to the output and the reference voltage source.

4. The peak detector of claim 1, further comprising a control circuit configured to close both of the first input switch and the second input switch in each of the plurality of amplitude detection circuits, one amplitude detection circuit at a time.

5. The peak detector of claim 1, wherein each of the plurality of amplitude detection circuits further comprises:
   a first resistor-capacitor (RC) circuit coupled to the first signal input by the first input switch; and
   a second RC circuit coupled to the second signal input by the second input switch.

6. The peak detector of claim 5, the averaging circuit comprises:
   a plurality of capacitors, each coupled to the output of a corresponding one of the plurality of amplitude detection circuits; and
   a plurality of averaging switches, each coupled to the outputs of two of the plurality of amplitude detection circuits,
   wherein the plurality of averaging switches is coupled in series to couple each of the outputs of each of the plurality of amplitude detection circuits to the peak detector output.

7. The peak detector of claim 6, further comprising a control circuit configured to close the plurality of averaging switches to couple the plurality of capacitors to the peak detector output.

8. The peak detector of claim 1, further comprising:
   a first resistor-capacitor (RC) circuit coupled to the first signal input and to the first input switch of each of the plurality of amplitude detection circuits; and
   a second RC circuit coupled the second signal input and to the second input switch of each of the plurality of amplitude detection circuits.

9. The peak detector of claim 1, wherein:
   the plurality of amplitude detection circuits includes a plurality of odd amplitude detection circuits and a plurality of even amplitude detection circuits; and
   the averaging circuit comprises:
      a plurality of capacitors comprising:

a first capacitor coupled to the output of a first even amplitude detection circuit of the plurality of even amplitude detection circuits; and a plurality of second capacitors, each coupled to the output of one of the plurality of odd amplitude detection circuits; and a plurality of averaging switches, each coupled to the output of a corresponding one of the plurality of odd amplitude detection circuits and a corresponding one of the plurality of even amplitude detection circuits; and the output of the first even amplitude detection circuit is coupled to the outputs of the plurality of odd amplitude detection circuits and to the peak detector output.

10. The peak detector of claim 9, a control circuit configured to, for each of the plurality of odd amplitude detection circuits, one at a time, close the averaging switch of the plurality of averaging switches coupling the one of the plurality of second capacitors corresponding to the odd amplitude detection circuit to the first capacitor.

11. The peak detector of claim 10, the control circuit further configured to close the plurality of averaging switches to couple the capacitors of each of the plurality of even amplitude detection circuits to the peak detector output.

12. An integrated circuit (IC), comprising:
a transmitter configured to generate a transmission signal;
a PLL comprising a voltage-controlled oscillator (VCO) configured to generate an output signal having an amplitude based on a control voltage, the PLL configured to control a frequency of the transmission signal;
a peak detector comprising:
a plurality of amplitude detection circuits coupled in parallel to a first signal input and a second signal input, each of the plurality of amplitude detection circuits configured to generate a voltage on an output indicating a voltage difference between the first signal input and the second signal input; and
an averaging circuit coupled to the output of each of the plurality of amplitude detection circuits, the averaging circuit configured to generate, on a peak detector output, an average voltage comprising an average of the voltages generated on the outputs of the plurality of amplitude detection circuits; and
a range sensor configured to:
determine whether the average voltage on the peak detector output is outside a voltage range; and
adjust the control voltage in response to determining the average voltage on the peak detector output is outside a voltage range.

13. The IC of claim 12, wherein each of the plurality of amplitude detection circuits of the peak detector further comprises:
a source follower circuit configured to generate the voltage on the output based on a higher voltage on one of the first input and the second signal input.

14. The IC of claim 12, wherein each of the plurality of amplitude detection circuits of the peak detector further comprises:
a first input switch coupled to the first signal input; and
a second input switch coupled to the second signal input.

15. The IC of claim 14, further comprising a control circuit configured to close both of the first input switch and the second input switch in each of the plurality of amplitude detection circuits, one amplitude detection circuit at a time sequentially.

16. A method of detecting an amplitude in a peak detector, the peak detector comprising:
a plurality of amplitude detection circuits coupled in parallel to a first signal input and a second signal input, each of the plurality of amplitude detection circuits comprising an output;
an averaging circuit coupled to the output of each of the plurality of amplitude detection circuits; and
a peak detector output,
the method comprising:
generating, on the output of each of the plurality of amplitude detection circuits, a peak voltage indicating an amplitude of an input signal received on the first signal input and the second signal input;
generating, on the peak detector output, an average voltage comprising an average of the peak voltages on the outputs of the plurality of amplitude detection circuits;
generating the peak voltage on the output of each of the plurality of amplitude detection circuits further comprises coupling each of the plurality of amplitude detection circuits, one at a time, sequentially, to the first signal input and the second signal input.

17. The method of claim 16, wherein generating the average voltage on the peak detector output further comprises coupling the outputs of the plurality of amplitude detection circuits to the peak detector output.

18. The method of claim 16, wherein the plurality of amplitude detection circuits comprises even amplitude detection circuits and odd amplitude detection circuits and generating the average voltage on the peak detector output wherein generating the peak voltage on the output of each of the amplitude detection circuits further comprises:
for each odd amplitude circuit, coupling the output to an odd output capacitor and coupling the odd output capacitor to the output of a corresponding even amplitude detection circuit to generate a pair average voltage on the output of the corresponding even amplitude detection circuit;
coupling outputs of the even amplitude detection circuits, each comprising a pair average voltage, to the peak detector output.

* * * * *